(12) United States Patent
Son et al.

(10) Patent No.: US 9,634,228 B2
(45) Date of Patent: Apr. 25, 2017

(54) PIEZO VIBRATION MODULE

(71) Applicant: SAMSUNG ELECTRO-MECHANICS CO., LTD., Suwon-si (KR)

(72) Inventors: Yeon Ho Son, Suwon-si (KR); Kyung Su Park, Suwon-si (KR); Seung Hyeon Jeong, Suwon-si (KR); Joon Choi, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 486 days.

(21) Appl. No.: 14/227,343

(22) Filed: Mar. 27, 2014

(65) Prior Publication Data

US 2014/0292144 A1    Oct. 2, 2014

(30) Foreign Application Priority Data

Mar. 29, 2013 (KR) .................. 10-2013-0034737

(51) Int. Cl.
| | | |
|---|---|---|
| *H01L 41/08* | (2006.01) | |
| *H01L 41/053* | (2006.01) | |
| *B06B 1/06* | (2006.01) | |
| *H01L 41/047* | (2006.01) | |
| *H01L 41/09* | (2006.01) | |

(52) U.S. Cl.
CPC .......... *H01L 41/053* (2013.01); *B06B 1/0603* (2013.01); *B06B 1/0662* (2013.01); *H01L 41/0475* (2013.01); *H01L 41/0933* (2013.01)

(58) Field of Classification Search
CPC ............... H01L 41/053; H01L 41/0933; H01L 41/0475; B06B 1/0603
USPC ................... 310/328, 324, 348, 323.01, 363

IPC ........................................... H01L 41/08,41/047
See application file for complete search history.

(56) References Cited

U.S. PATENT DOCUMENTS

| | | | | |
|---|---|---|---|---|
| 4,384,230 A | * | 5/1983 | Wisner ................. | H01L 41/042 310/328 |
| 5,438,469 A | * | 8/1995 | Rudi .................... | G11B 5/5504 |
| 5,714,832 A | * | 2/1998 | Shirrod ................. | A61B 1/227 310/328 |
| 2009/0236940 A1 | | 9/2009 | Nakayama et al. | |

(Continued)

FOREIGN PATENT DOCUMENTS

| | | |
|---|---|---|
| CN | 202135103 U | 2/2012 |
| JP | H8-275564 | 10/1996 |

(Continued)

OTHER PUBLICATIONS

Office action dated Feb. 10, 2015 from corresponding Japanese Patent Application No. 2014-026105 and its English translation.

(Continued)

*Primary Examiner* — Thomas Dougherty
*Assistant Examiner* — Karen B Addison
(74) *Attorney, Agent, or Firm* — LRK Patent Law Firm

(57) ABSTRACT

Disclosed herein is a piezo vibration module, including: a piezo element having a pattern of an internal electrode printed therein and having an external electrode connected to the internal electrode disposed on an outer surface thereof; a flexible printed circuit board (FPCB) having each terminal and applying power to the external electrodes of the piezo element; and a conductive adhesive interposed between the piezo element and the FPCB to electrically connect the piezo element to the flexible printed circuit board.

12 Claims, 3 Drawing Sheets

(56) References Cited

U.S. PATENT DOCUMENTS

2012/0212100 A1 8/2012 Lee
2012/0326568 A1 12/2012 Liu et al.

FOREIGN PATENT DOCUMENTS

| | | |
|---|---|---|
| JP | 2005-045691 | 2/2005 |
| JP | 2006-094597 A | 4/2006 |
| JP | 2008-085469 A | 4/2008 |
| JP | 2009-500832 | 1/2009 |
| JP | 2009-147025 | 7/2009 |
| JP | 2009-255036 A | 11/2009 |
| JP | 2010-138317 | 6/2010 |
| JP | 2011-191358 | 11/2011 |
| KR | 10-0490501 B1 | 5/2005 |
| KR | 2008-0070680 A | 7/2008 |
| KR | 10-2011-0045486 A | 5/2011 |
| KR | 10-1157868 B1 | 6/2012 |
| WO | 2007/005671 | 1/2007 |

OTHER PUBLICATIONS

SIPO Office Action for Chinese Patent Application No. 10-201410079457.6 which corresponds to the above-referenced U.S. application
KIPO Notice of Allowance for Korean Patent Application No. 10-2013-0034737 which corresponds to the above-referenced U.S. application.

* cited by examiner

PIEZO VIBRATION MODULE

CROSS REFERENCE TO RELATED APPLICATION

This application claims the benefit of Korean Patent Application No. 10-2013-0034737, filed on Mar. 29, 2013, entitled "Piezo Vibration Module" which is hereby incorporated by reference in its entirety into this application.

BACKGROUND OF THE INVENTION

1. Technical Field

The present invention relates to a piezo vibration module.

2. Description of the Related Art

Generally, in portable electronic devices, such as a portable phone, an E-book terminal, a game machine, a PMP, and the like, a vibration function has been variously utilized.

In particular, a vibration generating apparatus for generating the vibration has been mainly mounted in the portable electronic device to be used as an alert function that is a silent receiving signal.

With the multi-functionalization of the portable electronic device, a demand for small, integrated, and multi-functional vibration generating apparatus have increased.

Further, with the recent demand by users to conveniently use the portable electronic device, a touch type device performing an input by touching the portable electronic device has been adopted generally.

A concept of a currently prevalently used haptic device includes a concept of reflecting intuitive experience of an interface user and diversifying feedback for a touch, in addition to a concept of performing an input by a touch.

In general, the haptic device is repeatedly deformed by being expanded and/or contracted depending on the application of an external power supply of a piezo element to provide vibrations. In connection with this, a vibration generator adopting the piezo element is disclosed in Patent Document 1.

The piezo vibration apparatus disclosed in Patent Document 1 generates vibrations by vertically displacing both ends as much as possible using a central portion as a vibration point of application depending on a polarity change of applied voltage or generates vibrations by vertically displacing both ends as much as possible using a central portion as a vibration point of application.

The piezo vibration apparatus includes a substrate, a piezo element layer in which a piezo material is laminated on one surface or both surfaces of the substrate, and an electrode layer for applying voltage to upper and lower surfaces of the piezo element layer. However, the piezo vibration apparatus according to the Patent Document 1 does not disclose in detail the piezo element layer and a current applying method. As known to a person with ordinary skill to which the present invention pertains, when the piezo element layer is applied with a signal from the substrate, a phenomenon that the piezo element layer is separated from the piezo element soldered to an end of the substrate due to a repetitive vibration movement of the piezo element layer often occurs. In detail, a crack may occur due to a sudden rigidity change of a pattern applied with lead of a PCB and a portion at which a pattern is not formed, for example, at the time of external impact. The crack may cause a short-circuit phenomenon at the PCB and an external electrode of the piezo element. Further, since the soldered portion is generally exposed to the outside, there is the inconvenience of enclosing the soldered portion with an insulating tape, and the like, so as to prevent a short-circuit risk.

Herein, the substrate may be a PCB substrate, a plastic substrate on which an electrode pattern is printed, and the like, or may be made of metal, and the like.

PRIOR ART DOCUMENT

Patent Document (Patent Document 1) Patent Document 1: Korean Patent Laid-open Publication No. 10-2011-0045486

SUMMARY OF THE INVENTION

The present invention has been made in an effort to provide a piezo vibration module capable of improving an unmating force while preventing a crack between an external electrode of a piezo element and an FPCB.

According to a preferred embodiment of the present invention, there is provided a piezo vibration module, including: a piezo element having a pattern of an internal electrode printed therein and having an external electrode connected to the internal electrode disposed on an outer surface thereof; a flexible printed circuit board (FPCB) having each terminal and applying power to the external electrodes of the piezo element; and a conductive adhesive interposed between the piezo element and the FPCB to electrically connect the piezo element to the flexible printed circuit board.

The conductive adhesive may be interposed between the external electrode of the piezo element and the terminal.

The conductive adhesive may further include a filler selected from a group consisting of epoxy, silver (Ag), and a combination thereof.

Optionally, the conductive adhesive may be formed in a thin film conductive tape form or be formed of a thermal evaporation tape.

The piezo vibration module may further include: an upper case having an opened lower surface and having an inner space formed therein; a lower case coupled with a lower surface of the upper case to shield the inner space of the upper case; and a vibration plate including a flat lower plate mounted with the piezo element and a pair of upper plates vertically upward standing at a center of both sides of the lower plate and disposed in the upper case and the lower case to be vertically driven, the piezo element suffers from a repetitive expansion and contraction deformation depending on application of external power to generate a vibration force and one end of the flexible printed circuit board is attached to the piezo element by the conductive adhesive and the other end thereof is drawn to an outside of the piezo vibration module.

The vibration plate may include a weight body additionally disposed between the pair of upper plates in order to increase the vibration force of the piezo element.

The lower case and the lower plate may be spaced apart from each other at a predetermined interval so as to secure a vertical maximum displacement based on a polarity change of the piezo element. The lower plate and the lower case may be spaced apart from each other via the coupling portion vertically protruding at both ends of the lower case.

The coupling portion may form a guide groove and the guide groove may help to lengthily extend the other end of the flexible printed circuit board to the outside.

The piezo vibration module may further include: a first buffer member disposed between the vibration plate and the upper case.

The piezo vibration module may further include: a third buffer member disposed between the vibration plate and the lower case.

The piezo vibration module may further include: a second buffer member disposed at both sides of a lower portion of the weight body.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
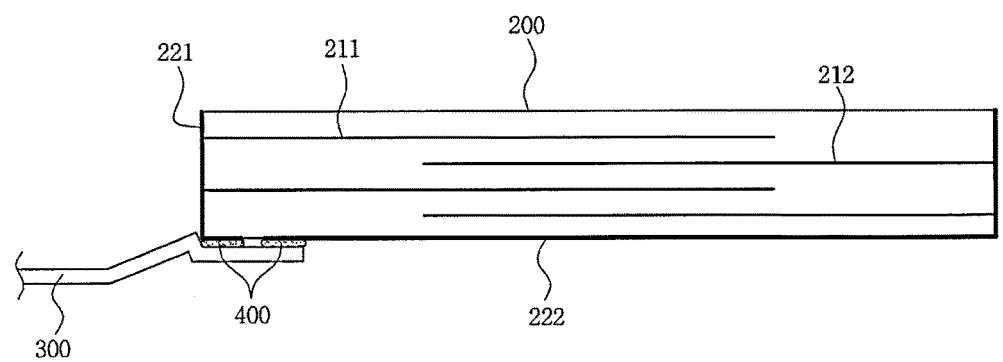
FIG. 1 is a diagram illustrating a schematic coupling state of a piezo element and a flexible printed circuit board in a piezo vibration module according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the prior art would obscure the gist of the present invention, the description thereof will be omitted.

Hereinafter, a piezo vibration module according to preferred embodiments of the present invention will be described in detail with reference to the accompanying drawings.

Various advantages and features of the present invention and methods accomplishing thereof will become apparent from the following description of embodiments with reference to the accompanying drawings. In the present specification, in adding reference numerals to components shown in each of the accompanying drawings, it is to be noted that like reference numerals designate like or similar components throughout the specification. Further, in the present specification, when a detailed description of the known art related to the present invention obscures the gist of the present invention, the detailed description thereof will be omitted.

FIG. 1 is a diagram illustrating a schematic coupling state of a piezo element and a flexible printed circuit board in a piezo vibration module according to a preferred embodiment of the present invention.

The piezo vibration module according to the preferred embodiment of the present invention may generate vibrations by a repetition of contraction and/or expansion deformation of a piezo element 200 according to application power supplied from a printed circuit board 300, preferably, a flexible printed board 300 (hereinafter, FPCB).

Preferably, in a piezo vibration module 1 (see FIGS. 2 and 3), the external electrodes 221 and 222 of the piezo element 200 and a terminal of an FPCB 300 are electrically connected to each other by a conductive adhesive 400.

The piezo element 200 is integrated as a single body by alternately printing patterns of internal electrodes 211 and 212 designed in a desired form on a thinly formed sheet and stacking each sheet having the internal electrodes 211 and 212 printed thereon in a multilayer form and then firing the stacked object. The piezo element 200 includes external electrodes which are at both ends of an outer surface of the piezo element 200. The external electrodes are electrically connected to, for example, each terminal of the FPCB 300 by the conductive adhesive 400, such that the external electrode may be fixed and mounted. For reference, as described above, one end of the FPCB 300 is received in the piezo vibration module according to the preferred embodiment of the present invention so as to be able to be connected to each of the external electrodes 221 and 222 of the piezo element 200, while the other end of the FPBC 300 is drawn to an outside of the piezo vibration module covered with an upper case and a lower case.

In addition, the piezo element 200 may be stacked in a single layer form or a multilayer form. The piezo element stacked in the multilayer form may secure electric field required to drive the piezo element even in low external voltage. Therefore, in the preferred embodiment of the present invention, the piezo element 200 stacked in the multilayer form may be adopted to lower driving voltage of the piezo vibration module according to the preferred embodiment of the present invention.

In addition, the piezo element 200 needs to be manufactured in the multilayer form having a predetermined thickness so as to meet a user's desired oscillation frequency while lowering a height of the piezo vibration module.

At the time of the repetition of the contraction and expansion deformation of the piezo element 200 or the external impact, a stress is concentrated on soldered portions between the piezo element 200 according to the preferred embodiment of the present invention and the FPCB 300 to provide a rigidity change at an interface surface (between a portion at which a pattern is printed with lead and a portion at which a pattern is not printed), such that a crack may often occur.

Therefore, according to the preferred embodiment of the present invention, in order to previously prevent stress concentration by maximally excluding the rigidity of the interface surface of the FPCB 300 and between the FPCB 300 and the external electrodes 221 and 222 of the piezo element 200, as described above, the conductive adhesive 400 is interposed at an opposite surface of the FPCB and the piezo element and external exposure of the conductive adhesive 400 may be minimized.

In summary, the preferred embodiment of the present invention uses the conductive adhesive 400 interposed between the piezo element 200 and the FPCB 300 to secure the coupling state and conductivity together.

Optionally, the conductive adhesive 400 according to the preferred embodiment of the present invention may further include a filler capable of improving an unmating force between the piezo element 200 and the FPCB 300.

Preferably, the filler is a material selected from a group consisting of epoxy, silver, and a combination thereof and may be additionally included in the conductive adhesive 400.

As the conductive adhesive 400 according to the preferred embodiment of the present invention, a conductive tape having a thin film form and/or a thermal evaporation tape may be used.

Figure 2:
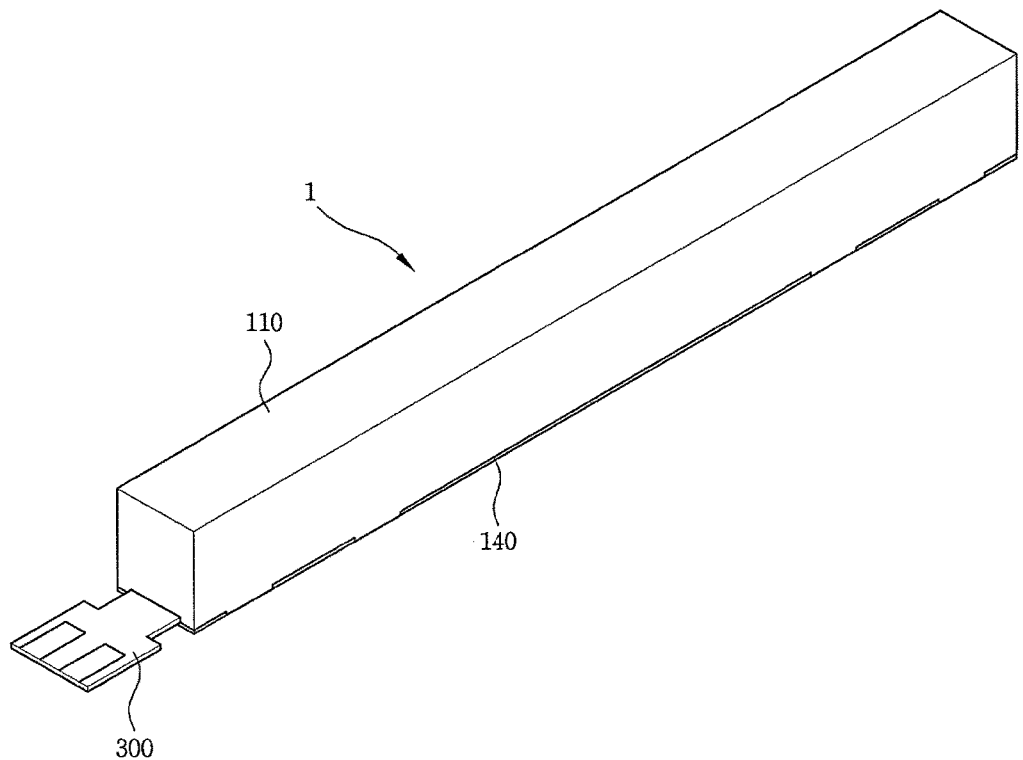
FIG. 2 is a perspective view of the piezo vibration module according to the preferred embodiment of the present invention.
Figure 3:
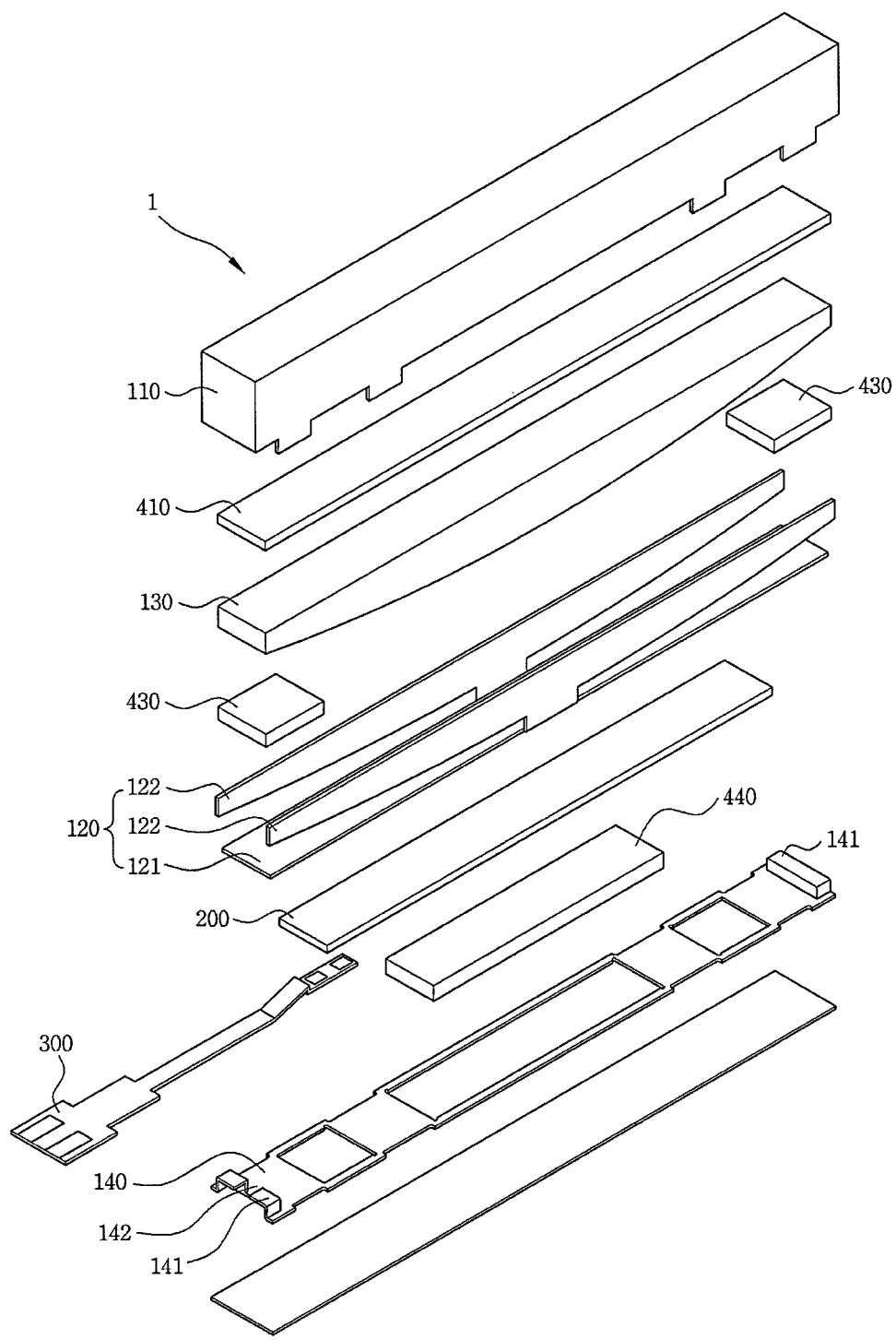
FIG. 3 is an exploded perspective view of the piezo vibration module illustrated in FIG. 2.
Figure 4:
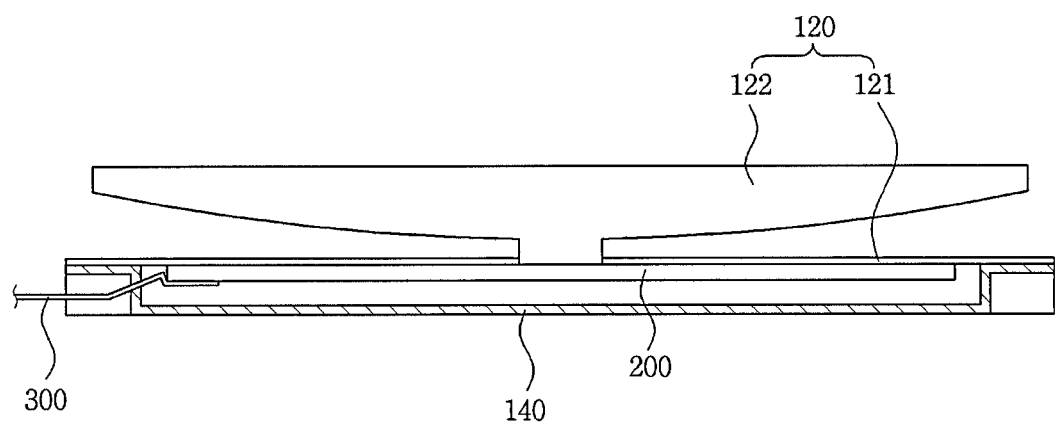
FIG. 4 is a cross-sectional view of the piezo vibration module illustrated in FIG. 2.

Referring to FIGS. 2 and 4, the piezo vibration module 1 according to the preferred embodiment of the present invention includes an upper case 110, a vibration plate 120, a weight body 130, and a lower case 140. The piezo vibration module 1 configured as described above may be used as a means for transferring a vibration force to, for example, a touch screen panel (not illustrated). Herein, FIG. 4 illustrates a state in which the upper case and each buffer member are excluded, so as to confirm an arrangement state between the respective components of the piezo vibration module according to the preferred embodiment of the present invention.

The upper case 110 is formed in a box shape of which the one side is opened and the inner space thereof receives a driving body, in other words, a vibration plate 120 mounted with the piezo element 200.

The vibration plate 120 transfers the vibration force of the piezo element 200 to the external parts through a bending action generated by the repetition of the expansion and contraction deformation, along with the piezo element 200 and includes a flat lower plate 121. A flat one surface (in detail, lower surface) of the lower plate 121 is provided with the piezo element 200 and the other surface (in detail, upper surface) of the lower plate 121 is provided with the weight body 130. The vibration plate 120 includes the flexible printed circuit board 300 (hereinafter, FPCB) or the printed circuit board that applies power for driving the piezo element 200.

In particular, the vibration plate 120 is made of a metal material having an elastic force, for example, SUS, so that the vibration plate 120 may be integrally deformed with the piezo device 200 that is subjected to the repetitive expansion and contraction deformation depending on external power applied thereto. Further, when the vibration plate 120 and the piezo element 200 are coupled with each other by a bonding scheme, the vibration plate 120 and the piezo element 200 may also be made of an invar that is a material having a coefficient of thermal expansion similar to that of the piezo element in order to previously prevent the bending phenomenon that may occur by the hardening of the bonding member.

As described above, the vibration plate 120 is made of invar that is a material having a coefficient of thermal expansion similar to that of the piezo device 200. Therefore, since thermal stress occurring when the piezo element 200 is operated or is applied with thermal impact even under a high temperature external environment decreases, the piezo element 200 has an effect of preventing a piezo deterioration phenomenon that electrical characteristics are deteriorated.

Optionally, as illustrated, the vibration plate 120 may include a pair of upper plates 122 vertically upward standing at both sides of the lower plate 121, in addition to the flat lower plate 121. The upper plate 122 is fixed to a central portion of the lower plate 121. The lower plate 121 and the upper plate 122 may be formed of an integral single component or may be fixed to each other in various bonding schemes.

The pair of upper plates 122 may be disposed to be in parallel with each other by, for example, a width of the lower plate 121 and may have the weight body 130 disposed therebetween. The weight body 130, which is a medium maximally increasing the vibration force, is formed to be inclined upwardly from a central body of the weight body 130 toward both ends thereof in order to prevent a contact with the lower plate 121 of the vibration plate 120. Therefore, the upper plate 122 are also formed to be inclined upwardly from a central portion thereof toward both ends thereof, similar to the side shape of the weight body 130.

As described above, in the structure in which the vibration plate 120 includes the upper plate 122, since the weight body 130 does not contact the lower plate 121, the piezo element 200 may also be disposed on a flat one surface of the lower plate 121.

For reference, the weight body 130 may be made of a metal material, preferably, a tungsten material having relatively high density in the same volume.

As illustrated, the lower case 140 is formed of a plate having a generally elongated flat shape and is formed to have a size and a shape to close an opened lower surface of the upper case 110.

The upper case 110 and the lower case 140 may be coupled to each other in various schemes, such as a caulking scheme, a welding scheme, a bonding scheme, and the like, well-known to those skilled in the art.

When power is applied to the piezo element 200, the piezo element 200 is completely attached to the lower plate 121, such that a moment is generated at the central portion of the lower plate 121 through the expansion or contraction deformation. The moment is generated in the state in which the lower plate 121 is fixed to both ends of the lower case 140, the central portion of the vibration plate 120 may be vertically deformed.

As described above, even though the vibration plate is vertically vibrated, the vibration plate 120 needs to be spaced apart from the upper and lower cases 110 and 140 in parallel at a predetermined interval so as to prevent the contact with the upper and lower cases 110 and 140.

Therefore, in the piezo vibration module 1 according to the preferred embodiment of the present invention, coupling portions 141 vertically protruding upward at both ends of the lower case 140 are formed. Both ends of the two coupling portions 141 are supported to the lower plate 121 of the vibration plate 120 to generally space between the lower case 140 and the piezo element 200. The flat lower plate 121 is seated on the coupling portions 141 formed at both ends of the lower case 140 to space the lower plate 121 of the vibration plate 120 and the lower case 140, thereby providing a space.

In addition, the two coupling ends 141 form a guide groove 142 to provide a path capable of penetrating through the FPCB 300. This may make the FPCB 300 extend to the outside by penetrating through a portion of the piezo vibration module 1 without contacting other components.

Unlike this, the lower plate 121 may be fixedly coupled with both ends of the lower case 140 through a step part (not illustrated) vertically downward protruding at both ends thereof.

Optionally, an upper portion of the weight body 130 is provided with at least one first buffer member 410 and is disposed to face an inner side of an upper surface of the upper case 110 The first buffer member may previously prevent a damage of the piezo element 200 due to the direct impact force transferred to the lower plate 121 including the piezo element 200, for example, at the time of the falling of the piezo vibration module 1 and the impact with the inner components according to the increase in the driving displacement of the piezo element 200.

In addition, the piezo vibration module 1 according to the preferred embodiment of the present invention includes second buffer members 430 disposed at both sides of the lower portion of the weight body 130 to prevent the direct contact between the weight body 130 and the lower plate 121.

In addition, the piezo vibration module 1 according to the preferred embodiment of the present invention includes a third buffer member 440 disposed on a central portion of the lower case 140 to prevent the direct contact between the lower plate 121 and the lower case 140 via the third buffer member 440.

Optionally, the first buffer member, the second buffer member, and the third buffer member may be made of a rubber material, but may be made of various materials without being limited.

As set forth above, according to the preferred embodiments of the present invention, the piezo vibration module capable of improving the coupling state between the external electrode of the piezo element and the printed circuit board (in detail, flexible printed circuit board) can be provided to prevent the crack from occurring between the piezo element and the flexible printed circuit board that are electrically connected with each other, under the expansion and contraction deformation of the piezo element applied with current from the flexible printed circuit board.

Further, according to the preferred embodiments of the present invention, the piezo element and the flexible printed circuit board can be fixed to be electrically connected to each other by having the conductive adhesive interposed therebetween.

In addition, according to the preferred embodiments of the present invention, the height in the inner space of the piezo vibration module can be secured by removing the soldered portion protruding by the soldering method to minimize the collision between the components, thereby helping to improve the durability thereof.

Also, according to the preferred embodiments of the present invention, it is possible to secure unmating force by applying the additional filler to the conductive adhesive. Moreover, according to the preferred embodiments of the present invention, the conductive adhesive can be interposed at the opposite surface of the FPCB and the piezo element to minimize exposure to the outside.

Although the embodiment of the present invention has been disclosed for illustrative purposes, it will be appreciated that a piezo vibration module according to the invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A piezo vibration module, comprising:
    a piezo element having a pattern of an internal electrode printed therein and having an external electrode connected to the internal electrode and disposed on an outer surface thereof;
    a flexible printed circuit board (FPCB) having each terminal and applying power to the external electrode of the piezo element; and
    a conductive adhesive interposed between the piezo element and the FPCB to electrically connect the piezo element to the FPCB,
    wherein the conductive adhesive further includes a filler selected from a group consisting of epoxy, silver (Ag), and a combination thereof.

2. The piezo vibration module as set forth in claim 1, wherein the conductive adhesive is interposed between the external electrode of the piezo element and the terminal.

3. The piezo vibration module as set forth in claim 1, wherein the conductive adhesive is formed in a thin film conductive tape form.

4. The piezo vibration module as set forth in claim 1, wherein the conductive adhesive is formed of a thermal evaporation tape.

5. The piezo vibration module as set forth in claim 1, further comprising:
    an upper case having an opened lower surface and having an inner space formed therein;
    a lower case coupled with a lower surface of the upper case to shield the inner space of the upper case; and
    a vibration plate including a flat lower plate mounted with the piezo element and a pair of upper plates vertically upward standing at a center of both sides of the lower plate and disposed in the upper case and the lower case to be vertically driven,
    wherein the piezo element suffers from a repetitive expansion and contraction deformation depending on application of external power to generate a vibration force, and
    one end of the FPCB is attached to the piezo element by the conductive adhesive and the other end thereof is drawn to an outside of the piezo vibration module.

6. The piezo vibration module as set forth in claim 5, wherein the vibration plate includes a weight body additionally disposed between the pair of upper plates in order to increase the vibration force of the piezo element.

7. The piezo vibration module as set forth in claim 5, wherein the lower case and the lower plate are spaced apart from each other at a predetermined interval.

8. The piezo vibration module as set forth in claim 5, further comprising:
    a first buffer member disposed between the vibration plate and the upper case.

9. The piezo vibration module as set forth in claim 5, further comprising:
    a third buffer member disposed between the vibration plate and the lower case.

10. The piezo vibration module as set forth in claim 6, further comprising:
    a second buffer member disposed at both sides of a lower portion of the weight body.

11. The piezo vibration module as set forth in claim 5, wherein the lower case includes a coupling portion vertically upward protruding at both ends thereof.

12. The piezo vibration module as set forth in claim 11, wherein the coupling portion forms a guide groove.

* * * * *